(12) United States Patent
Yokouchi et al.

(10) Patent No.: US 7,965,927 B2
(45) Date of Patent: Jun. 21, 2011

(54) HEAT TREATMENT APPARATUS AND HEAT TREATMENT METHOD

(75) Inventors: Kenichi Yokouchi, Kyoto (JP); Jun Watanabe, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 867 days.

(21) Appl. No.: 11/871,241

(22) Filed: Oct. 12, 2007

(65) Prior Publication Data

US 2008/0101780 A1    May 1, 2008

(30) Foreign Application Priority Data

Oct. 30, 2006    (JP) .................................. 2006-293876

(51) Int. Cl.
*A21B 2/00* (2006.01)
(52) U.S. Cl. ..................... 392/416; 392/407; 392/418
(58) Field of Classification Search .................. None
See application file for complete search history.

(56) References Cited

U.S. PATENT DOCUMENTS

| 6,936,797 B2 | 8/2005 | Hosokawa |
| 6,998,580 B2 | 2/2006 | Kusuda et al. |

FOREIGN PATENT DOCUMENTS

| JP | 01-236616 | 9/1989 |
| JP | 10-41239 | 2/1998 |
| JP | 2004-55821 | 2/2004 |
| JP | 2004-88052 | 3/2004 |

*Primary Examiner* — Thor S Campbell
(74) *Attorney, Agent, or Firm* — Ostrolenk Faber LLP

(57) ABSTRACT

In a heat treatment apparatus, a holding part moves upwardly to receive a semiconductor wafer transported into a chamber and placed on support pins. The semiconductor wafer held in close proximity to a light-transmittable plate by the holding part is preheated by a hot plate, and is then flash-heated by a flash of light emitted from flash lamps. Thereafter, the holding part moves downwardly to transfer the semiconductor wafer to the support pins, and the semiconductor wafer is transported out of the chamber. Then, a new semiconductor wafer is transported into the chamber. The holding part is adapted to perform such a series of operations of moving upwardly and downwardly also when in a standby condition pending the transport of the first semiconductor wafer in a lot into the chamber.

4 Claims, 6 Drawing Sheets

F I G . 2
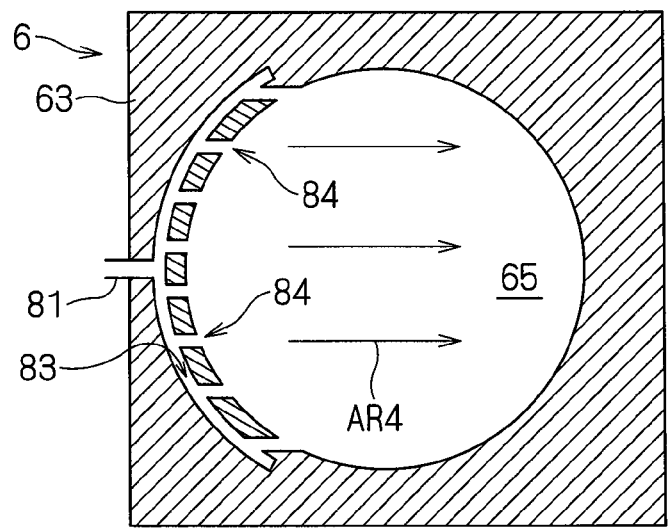
F I G . 3
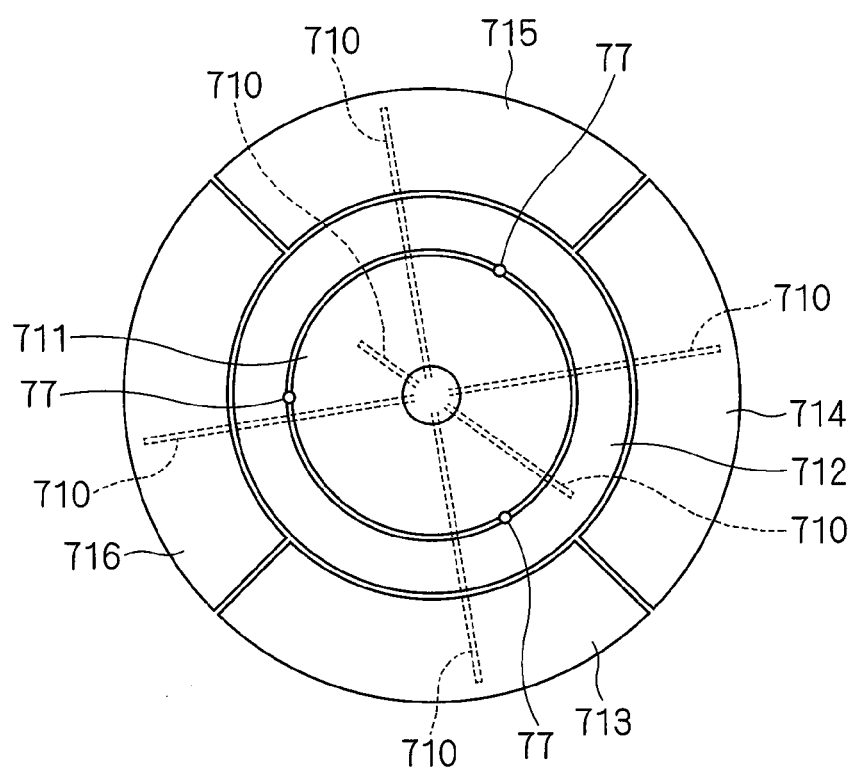

CONTROLLER
3

F I G. 5
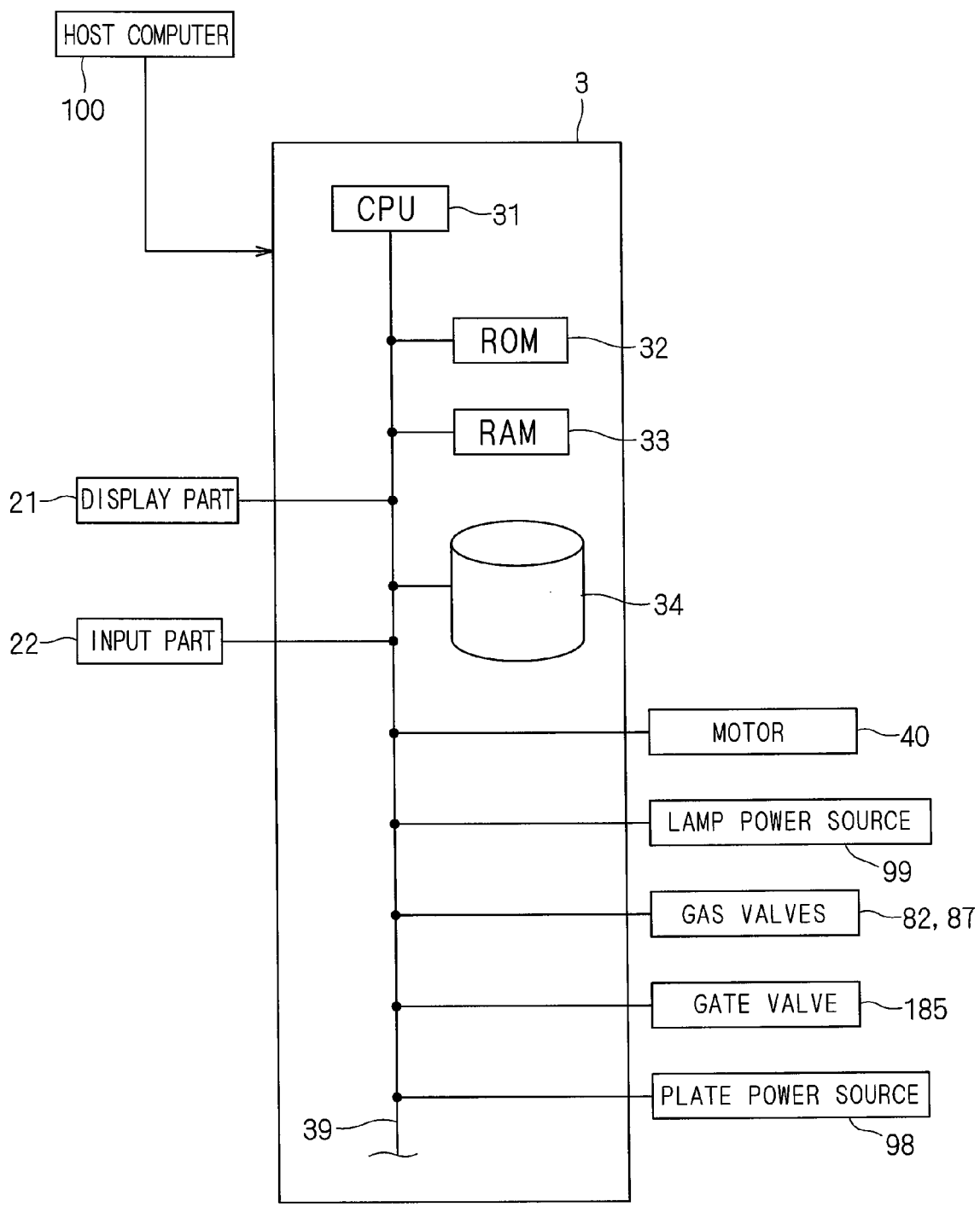

F I G. 6
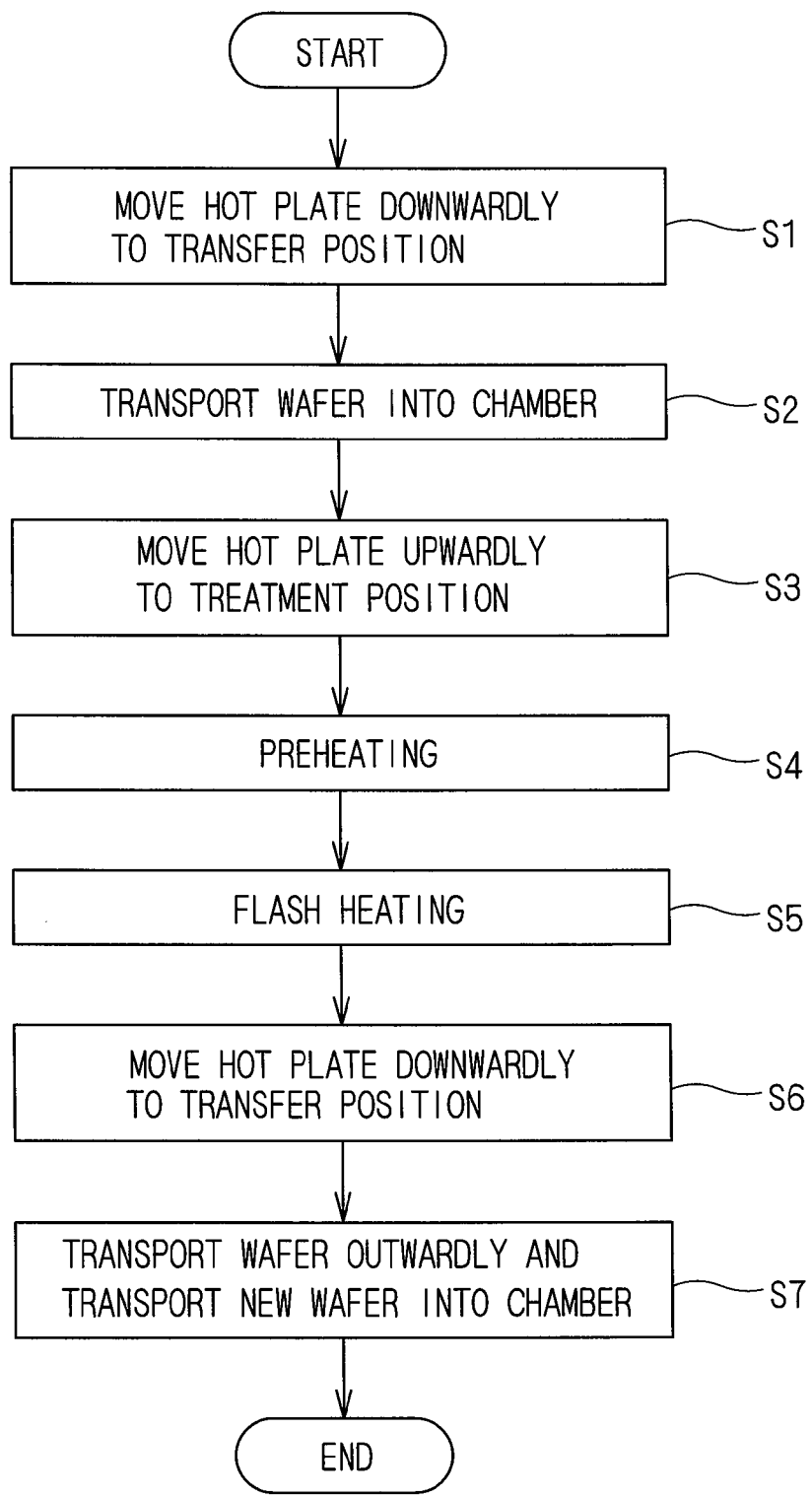

HEAT TREATMENT APPARATUS AND HEAT TREATMENT METHOD

BACKGROUND OF THE INVENTION

1. Field of the Invention

The present invention relates to a heat treatment technique for performing a heating process on a substrate including a semiconductor wafer, a glass substrate for a liquid crystal display device and the like, with the substrate placed on a heating plate. More particularly, the invention relates to a heat treatment apparatus and a heat treatment method for exposing a substrate placed on a heating plate to a flash of light emitted from a flash lamp to perform a heating process on the substrate.

2. Description of the Background Art

Conventionally, a lamp annealer employing a halogen lamp has been typically used in the step of activating ions in a semiconductor wafer after ion implantation. Such a lamp annealer carries out the activation of ions in the semiconductor wafer by heating (or annealing) the semiconductor wafer to a temperature of, for example, about 1000° C. to about 1100° C. Such a heat treatment apparatus utilizes the energy of light emitted from the halogen lamp to raise the temperature of a substrate at a rate of about hundreds of degrees per second.

In recent years, with the increasing degree of integration of semiconductor devices, it has been desired to provide a shallower junction as the gate length decreases. It has turned out, however, that even the execution of the process of activating ions in a semiconductor wafer by the use of the above-mentioned lamp annealer which raises the temperature of the semiconductor wafer at a rate of about hundreds of degrees per second produces a phenomenon in which the ions of boron, phosphorus and the like implanted in the semiconductor wafer are diffused deeply by heat. The occurrence of such a phenomenon causes the depth of the junction to exceed a required level, giving rise to an apprehension about a hindrance to good device formation.

To solve the problem, there has been proposed a technique for exposing the surface of a semiconductor wafer to a flash of light by using a xenon flash lamp to raise the temperature of only the surface of the semiconductor wafer implanted with ions in an extremely short time (several milliseconds or less). This technique is disclosed, for example, in U.S. Pat. Nos. 6,998,580 and 6,936,797. The xenon flash lamp has a spectral distribution of radiation ranging from ultraviolet to near-infrared regions. The wavelength of light emitted from the xenon flash lamp is shorter than that of light emitted from the conventional halogen lamp, and approximately coincides with a basic absorption band of a silicon semiconductor wafer. It is therefore possible to rapidly raise the temperature of the semiconductor wafer, with a small amount of light transmitted through the semiconductor wafer, when the semiconductor wafer is exposed to a flash of light emitted from the xenon flash lamp. Also, it has turned out that a flash of light emitted in an extremely short time of several milliseconds or less can achieve a selective temperature rise only near the surface of the semiconductor wafer. Therefore, the temperature rise in an extremely short time by using the xenon flash lamp allows the execution of only the ion activation without deeply diffusing the ions.

Unfortunately, it has turned out that, when such a heat treatment apparatus employing the xenon flash lamp performs a heating process on a plurality of (e.g., 25) semiconductor wafers in a lot (or batch) in succession, the first several wafers in the lot have a sheet resistance lower than that of the remaining wafers after the heating process, i.e., the temperature of the first several wafers during the heating process is higher than that of the remaining wafers. In particular, the temperature of the first one wafer in the lot during the heating process is extremely high. Thus, there arises a problem such that the conventional technique fails to uniformly heat-treat all of the semiconductor wafers in a lot.

SUMMARY OF THE INVENTION

The present invention is intended for a heat treatment apparatus for performing a heating process on a substrate, with the substrate placed on a heating plate.

According to the present invention, the heat treatment apparatus comprises: a chamber for housing the heating plate therein; a moving element for moving the heating plate within the chamber; and a controller for controlling the moving element to move the heating plate in accordance with a predetermined operating pattern when performing a steady process on a substrate to be treated, and to move the heating plate in accordance with the operating pattern also when in a standby condition pending the transport of the substrate into the chamber.

The heating plate is moved in accordance with the operating pattern for the steady process also when in the standby condition pending the transport of the substrate into the chamber. This places an environment within the chamber in a stable state similar to that obtained during the treatment of substrates in succession when the first substrate is transported into the chamber. Thus, the heat treatment apparatus is capable of performing a stabilized and uniform heat treatment on all of the substrates to be subjected to the heating process in succession.

Preferably, the heat treatment apparatus further comprises a flash lamp for emitting a flash of light to expose a preheated substrate held by the heating plate to the light, wherein the moving element moves the heating plate upwardly and downwardly between a transfer position and a treatment position, the transfer position being a position in which the heating plate lies when a substrate is transported into and out of the chamber, the treatment position being a position in which the heating plate lies when a substrate is exposed to a flash of light emitted from the flash lamp.

Thus, the heat treatment apparatus is capable of performing a stabilized and uniform heat treatment on all of the substrates to be subjected to the flash heating process in succession.

More preferably, the controller starts the upward and downward movement of the heating plate in the standby condition so that the heating plate is in the transfer position at the time of the transport of the substrate into the chamber.

The heat treatment apparatus is capable of transporting the substrate into the chamber to start the treatment without any wasteful waiting time.

The present invention is also intended for a heat treatment method for exposing a substrate placed on a heating plate to a flash of light emitted from a flash lamp to perform a heating process on the substrate.

It is therefore an object of the present invention to provide a heat treatment apparatus and a heat treatment method which are capable of performing a stabilized and uniform heat treatment on all substrates to be subjected to a heating process in succession.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a sectional view showing a gas passage in the heat treatment apparatus of FIG. 1;

FIG. 3 is a plan view showing a hot plate;

FIG. 5 is a block diagram showing the construction of a controller;

FIG. 6 is a flow diagram showing a procedure of operations when the heat treatment apparatus performs a steady process on a semiconductor wafer.

DESCRIPTION OF THE PREFERRED EMBODIMENTS

A preferred embodiment according to the present invention will now be described in detail with reference to the drawings.

Figure 1:
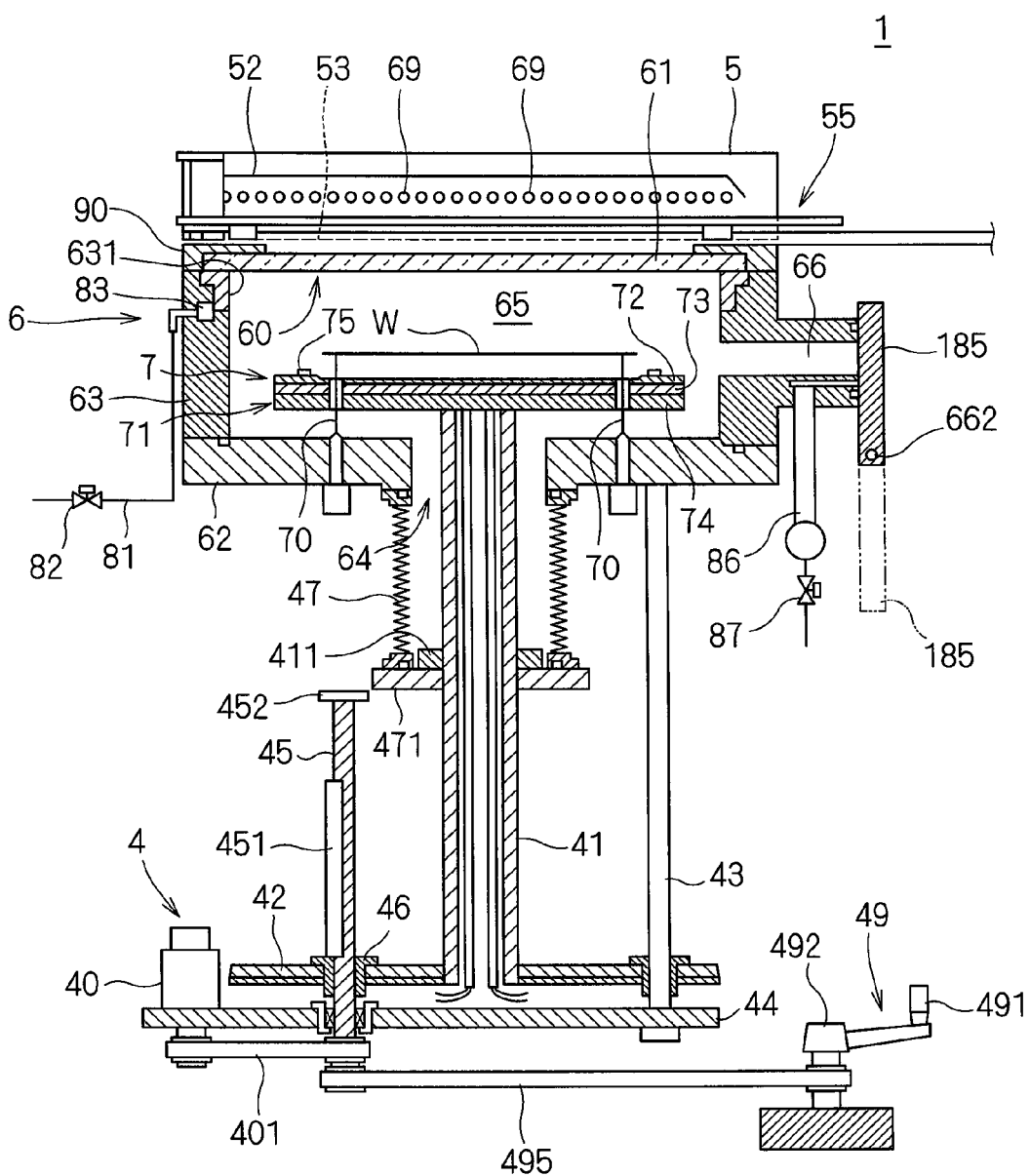
FIG. 1 is a side sectional view showing the construction of a heat treatment apparatus according to the present invention.
Figure 1:
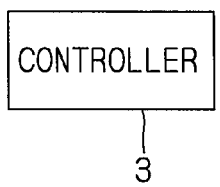

First, the overall construction of a heat treatment apparatus according to the present invention will be outlined. FIG. 1 is a side sectional view showing the construction of a heat treatment apparatus 1 according to the present invention. The heat treatment apparatus 1 is a flash lamp annealer for exposing a generally circular semiconductor wafer W serving as a substrate to a flash of light to heat the semiconductor wafer W.

The heat treatment apparatus 1 includes a chamber 6 of a generally cylindrical configuration for receiving a semiconductor wafer W therein. The chamber 6 includes a chamber side portion 63 having an inner wall of a generally cylindrical configuration, and a chamber bottom portion 62 for covering a bottom portion of the chamber side portion 63. A space surrounded by the chamber side portion 63 and the chamber bottom portion 62 is defined as a heat treatment space 65. A top opening 60 is formed over the heat treatment space 65.

The heat treatment apparatus 1 further includes: a light-transmittable plate 61 serving as a closure member mounted in the top opening 60 for closing the top opening 60; a holding part 7 of a generally disk-shaped configuration for preheating a semiconductor wafer W while holding the semiconductor wafer W within the chamber 6; a holding part elevating mechanism 4 for moving the holding part 7 upwardly and downwardly relative to the chamber bottom portion 62 serving as the bottom surface of the chamber 6; a lamp house 5 including xenon flash lamps (referred to simply as "flash lamps" hereinafter) 69 incorporated therein for directing a flash of light through the light-transmittable plate 61 onto the semiconductor wafer W held by the holding part 7 to heat the semiconductor wafer W; and a controller 3 for controlling the above-mentioned components to perform heat treatment.

The chamber 6 is provided under the lamp house 5. The light-transmittable plate 61 provided in an upper portion of the chamber 6 to constitute a chamber ceiling portion is a disk-shaped member made of, for example, quartz, and functions as a chamber window for allowing light emitted from the flash lamps 69 to travel therethrough into the heat treatment space 65. The chamber bottom portion 62 and the chamber side portion 63 which constitute the main body of the chamber 6 are made of, for example, a metal material having high strength and high heat resistance such as stainless steel and the like. A ring 631 provided in an upper portion of the inner side surface of the chamber side portion 63 is made of an aluminum (Al) alloy and the like having greater durability against degradation resulting from exposure to light than stainless steel.

An O-ring provides a seal between the light-transmittable plate 61 and the chamber side portion 63 so as to maintain the hermeticity of the heat treatment space 65. Specifically, the O-ring is fitted between a lower peripheral portion of the light-transmittable plate 61 and the chamber side portion 63, and a clamp ring 90 abuts against an upper peripheral portion of the light-transmittable plate 61 and is secured to the chamber side portion 63 by screws, thereby forcing the light-transmittable plate 61 against the O-ring.

The chamber bottom portion 62 is provided with a plurality of (in this preferred embodiment, three) upright support pins 70 extending through the holding part 7 for supporting the lower surface of the semiconductor wafer W. The support pins 70 are made of, for example, quartz, and are easy to replace because the support pins 70 are fixed externally of the chamber 6.

The chamber side portion 63 includes a transport opening 66 for the transport of the semiconductor wafer W therethrough into and out of the chamber 6. The transport opening 66 is openable and closable by a gate valve 185 pivoting about an axis 662. An inlet passage 81 for introducing a processing gas (for example, an inert gas including nitrogen ($N_2$) gas, helium (He) gas, argon (Ar) gas and the like, or oxygen ($O_2$) gas and the like) into the heat treatment space 65 is formed on the opposite side of the chamber side portion 63 from the transport opening 66. The inlet passage 81 has a first end connected through a gas valve 82 to a gas supply mechanism not shown, and a second end connected to a gas inlet buffer 83 formed inside the chamber side portion 63. The transport opening 66 is provided with an outlet passage 86 for exhausting the gas from the interior of the heat treatment space 65. The outlet passage 86 is connected through a gas valve 87 to an exhaust mechanism not shown.

FIG. 2 is a sectional view of the chamber 6 taken along a horizontal plane at the level of the gas inlet buffer 83. As shown in FIG. 2, the gas inlet buffer 83 extends over approximately one-third of the inner periphery of the chamber side portion 63 on the opposite side from the transport opening 66 shown in FIG. 1. The processing gas introduced through the inlet passage 81 to the gas inlet buffer 83 is fed through a plurality of gas feed holes 84 into the heat treatment space 65.

The holding part elevating mechanism 4 shown in FIG. 1 includes a shaft 41 of a generally cylindrical configuration, a movable plate 42, guide members 43 (three guide members 43 are actually provided around the shaft 41 in this preferred embodiment), a fixed plate 44, a ball screw 45, a nut 46, and a motor 40. The chamber bottom portion 62 serving as the bottom portion of the chamber 6 is formed with a bottom opening 64 of a generally circular configuration having a diameter smaller than that of the holding part 7. The shaft 41 made of stainless steel is inserted through the bottom opening 64 and connected to the lower surface of the holding part 7 (a hot plate 71 of the holding part 7 in a strict sense) to support the holding part 7.

The nut 46 for threaded engagement with the ball screw 45 is fixed to the movable plate 42. The movable plate 42 is slidably guided by the guide members 43 fixed to the chamber bottom portion 62 and extending downwardly therefrom, and is vertically movable. The movable plate 42 is coupled through the shaft 41 to the holding part 7.

The motor 40 is provided on the fixed plate 44 mounted to the lower end portions of the respective guide members 43, and is connected to the ball screw 45 through a timing belt 401. When the holding part elevating mechanism 4 moves the holding part 7 upwardly and downwardly, the motor 40 serving as a driver rotates the ball screw 45 under the control of the controller 3 to move the movable plate 42 fixed to the nut 46 vertically along the guide members 43. As a result, the shaft 41 fixed to the movable plate 42 moves vertically, whereby the holding part 7 connected to the shaft 41 smoothly moves upwardly and downwardly between a "transfer position" (the position of the holding part 7 shown in FIG. 1 within the chamber 6) in which the holding part 7 lies when the semiconductor wafer W is transported into and out of the chamber 6, and a "treatment position" (the position of the holding part 7 shown in FIG. 4 within the chamber 6) in which the holding part 7 lies when the semiconductor wafer W is exposed to a flash of light emitted from the flash lamps 69.

An upright mechanical stopper 451 of a generally semi-cylindrical configuration (obtained by cutting a cylinder in half in a longitudinal direction) is provided on the upper surface of the movable plate 42 so as to extend along the ball screw 45. If the movable plate 42 is to move upwardly beyond a predetermined upper limit because of any anomaly, the upper end of the mechanical stopper 451 strikes an end plate 452 provided at an end portion of the ball screw 45, whereby the abnormal upward movement of the movable plate 42 is prevented. This avoids the upward movement of the holding part 7 above a predetermined position lying under the light-transmittable plate 61, to thereby prevent a collision between the holding part 7 and the light-transmittable plate 61.

The holding part elevating mechanism 4 further includes a manual elevating part 49 for manually moving the holding part 7 upwardly and downwardly during the maintenance of the interior of the chamber 6. The manual elevating part 49 has a handle 491 and a rotary shaft 492. Rotating the rotary shaft 492 by means of the handle 491 causes the rotation of the ball screw 45 connected through a timing belt 495 to the rotary shaft 492, thereby moving the holding part 7 upwardly and downwardly.

An expandable/contractible bellows 47 surrounding the shaft 41 and extending downwardly from the chamber bottom portion 62 is provided under the chamber bottom portion 62, and has an upper end connected to the lower surface of the chamber bottom portion 62. The bellows 47 has a lower end mounted to a bellows lower end plate 471. The bellows lower end plate 471 is screw-held and mounted to the shaft 41 by a collar member 411. The bellows 47 contracts when the holding part elevating mechanism 4 moves the holding part 7 upwardly relative to the chamber bottom portion 62, and expands when the holding part elevating mechanism 4 moves the holding part 7 downwardly. When the holding part 7 moves upwardly and downwardly, the bellows 47 contracts and expands to maintain the heat treatment space 65 hermetically sealed.

The holding part 7 is housed in the chamber 6, and includes the hot plate (or heating plate) 71 for preheating (or assist-heating) the semiconductor wafer W, and a susceptor 72 provided on the upper surface (a surface on which the holding part 7 holds the semiconductor wafer W) of the hot plate 71; The shaft 41 for moving the holding part 7 upwardly and downwardly as mentioned above is connected to the lower surface of the holding part 7. The susceptor 72 is made of quartz (or may be made of aluminum nitride (AlN) or the like). Pins 75 for preventing the semiconductor wafer W from shifting out of place are mounted on the upper surface of the susceptor 72. The susceptor 72 is provided on the hot plate 71, with the lower surface of the susceptor 72 in face-to-face contact with the upper surface of the hot plate 71. Thus, the susceptor 72 diffuses heat energy from the hot plate 71 to transfer the heat energy to the semiconductor wafer W placed on the upper surface of the susceptor 72, and is removable from the hot plate 71 for cleaning during maintenance.

The hot plate 71 includes an upper plate 73 and a lower plate 74 both made of stainless steel. Resistance heating wires such as nichrome wires for heating the hot plate 71 are provided between the upper plate 73 and the lower plate 74, and an electrically conductive brazing metal containing nickel (Ni) fills the space between the upper plate 73 and the lower plate 74 to seal the resistance heating wires therewith. The upper plate 73 and the lower plate 74 have brazed or soldered ends.

FIG. 3 is a plan view of the hot plate 71. As shown in FIG. 3, the hot plate 71 has a circular zone 711 and an annular zone 712 arranged in concentric relation with each other and positioned in a central portion of a region opposed to the semiconductor wafer W held by the holding part 7, and four zones 713 to 716 into which a substantially annular region surrounding the zone 712 is circumferentially equally divided. Slight gaps are formed between these zones 711 to 716. The hot plate 71 is provided with three through holes 77 receiving the respective support pins 70 therethrough and circumferentially spaced 120° apart from each other in a gap between the zones 711 and 712.

In the six zones 711 to 716, the resistance heating wires independent of each other are disposed so as to make a circuit to form heaters, respectively. The heaters incorporated in the respective zones 711 to 716 individually heat the respective zones. The semiconductor wafer W held by the holding part 7 is heated by the heaters incorporated in the six zones 711 to 716. A sensor 710 for measuring the temperature of each zone by using a thermocouple is provided in each of the zones 711 to 716. The sensors 710 pass through the interior of the generally cylindrical shaft 41 and are connected to the controller 3.

For heating the hot plate 71, the controller 3 controls the amount of power supply to the resistance heating wires provided in the respective zones 711 to 716 so that the temperatures of the six zones 711 to 716 measured by the sensors 710 reach a previously set predetermined temperature. The temperature control in each zone by the controller 3 is PID (Proportional, Integral, Derivative) control. In the hot plate 71, the temperatures of the respective zones 711 to 716 are continually measured until the heat treatment of the semiconductor wafer W (the heat treatment of all semiconductor wafers W when the plurality of semiconductor wafers W are successively heat-treated) is completed, and the amounts of power supply to the resistance heating wires provided in the respective zones 711 to 716 are individually controlled, that is, the temperatures of the heaters incorporated in the respective zones 711 to 716 are individually controlled, whereby the temperatures of the respective zones 711 to 716 are maintained at the set temperature. The set temperature for the zones 711 to 716 may be changed by an individually set offset value from a reference temperature.

The resistance heating wires provided in the six zones 711 to 716 are connected through power lines passing through the interior of the shaft 41 to a plate power source 98 (see FIG. 5). The power lines extending from the plate power source 98 to the zones 711 to 716 are disposed inside a stainless tube filled with an insulator of magnesia (magnesium oxide) or the like so as to be electrically insulated from each other. The interior of the shaft 41 is open to the atmosphere.

The lamp house 5 shown in FIG. 1 includes the plurality of (in this preferred embodiment, 30) flash lamps 69, and a reflector 52. The plurality of flash lamps 69 each of which is a rodlike lamp having an elongated cylindrical configuration are arranged in a plane so that the longitudinal directions of the respective flash lamps 69 are in parallel with each other along a major surface of the semiconductor wafer W held by the holding part 7. The reflector 52 is provided over the plurality of flash lamps 69 to cover all of the flash lamps 69. The surface of the reflector 52 is roughened by abrasive blasting to produce a satin finish thereon. A light diffusion plate 53 (or a diffuser) is made of quartz glass having a surface subjected to a light diffusion process, and is provided on the lower surface side of the lamp house 5, with a predetermined spacing held between the light diffusion plate 53 and the light-transmittable plate 61. The heat treatment apparatus 1 further includes a lamp house movement mechanism 55 for moving the lamp house 5 upwardly relative to the chamber 6 and then sliding the lamp house 5 in a horizontal direction during maintenance.

Each of the xenon flash lamps 69 includes a glass tube containing xenon gas sealed therein and having positive and negative electrodes provided on opposite ends thereof and connected to a capacitor, and a trigger electrode wound on the outer peripheral surface of the glass tube. Because the xenon gas is electrically insulative, no current flows in the glass tube in a normal state. However, if a high voltage is applied to the trigger electrode to produce an electrical breakdown, electricity stored in the capacitor flows momentarily in the glass tube, and the Joule heat evolved at this time heats the xenon gas to cause light emission. The xenon flash lamps 69 have the property of being capable of emitting much intenser light than a light source that stays lit continuously because previously stored electrostatic energy is converted into an ultrashort light pulse ranging from 0.1 millisecond to 10 milliseconds.

The controller 3 controls the above-mentioned various operating mechanisms provided in the heat treatment apparatus 1. FIG. 5 is a block diagram showing the construction of the controller 3. The controller 3 is similar in hardware construction to a typical computer. Specifically, the controller 3 includes a CPU 31 for performing various computation processes, a ROM 32 or read-only memory for storing a basic program therein, a RAM 33 or readable/writable memory for storing various pieces of information, and a magnetic disk 34 for storing control software and data therein. These components 31 to 34 are connected to a bus line 39.

Electrically connected to the bus line 39 are the motor 40 of the holding part elevating mechanism 4 for moving the holding part 7 upwardly and downwardly within the chamber 6, a lamp power source 99 for supplying power to the flash lamps 69, the gas valves 82 and 87 for supplying and exhausting the processing gas into and from the chamber 6, the gate valve 185 for opening and closing the transport opening 66, the plate power source 98 for supplying power to the zones 711 to 716 of the hot plate 71, and the like. By executing the control software stored in the magnetic disk 34, the CPU 31 of the controller 3 controls these operating mechanisms to cause the heating process of the semiconductor wafer W to proceed.

A display part 21 and an input part 22 are also electrically connected to the bus line 39. The display part 21 is constructed using, for example, a liquid crystal display and the like, and displays various pieces of information such as processing results and recipe details. The input part 22 is constructed using, for example, a keyboard and a mouse, and accepts the entry of a command, a parameter and the like. An operator of the heat treatment apparatus 1 can enter a command, a parameter and the like through the input part 22 while viewing descriptions displayed on the display part 21. The display part 21 and the input part 22 may be integrated together into a touch panel device.

There is provided a host computer 100 ranking as a higher level control mechanism than the controller 3 for the heat treatment apparatus 1. Specifically, the heat treatment apparatus 1 is managed on-line by the host computer 100, and a plurality of heat treatment apparatuses 1 may be connected to the host computer 100. The host computer 100 includes a CPU for performing various computation processes, a ROM or read-only memory for storing a basic program therein, a RAM or readable/writable memory for storing various pieces of information, a magnetic disk for storing a control application and data therein, and the like. The host computer 100 is similar in construction to a typical computer. The host computer 100 provides a recipe containing descriptions about a processing procedure and processing conditions to the heat treatment apparatus 1, and transmits production management information about the semiconductor wafer W to the heat treatment apparatus 1.

The heat treatment apparatus 1 according to this preferred embodiment includes various cooling structures (not shown) in addition to the above-mentioned components to prevent an excessive temperature rise in the chamber 6 and the lamp house 5 because of the heat energy generated from the flash lamps 69 and the hot plate 71 during the heat treatment of the semiconductor wafer W. As an example, the chamber side portion 63 and the chamber bottom portion 62 of the chamber 6 are provided with a water cooling tube, and the lamp house 5 is provided with a supply pipe for supplying a gas to the interior thereof and an exhaust pipe with a silencer to form an air cooling structure. Compressed air is supplied to the gap between the light-transmittable plate 61 and (the light diffusion plate 53 of) the lamp house 5 to cool down the lamp house 5 and the light-transmittable plate 61 and to remove organic materials and the like present in the gap therefrom to suppress the deposition of the organic materials and the like onto the light diffusion plate 53 and the light-transmittable plate 61 during the heat treatment.

Figure 7:
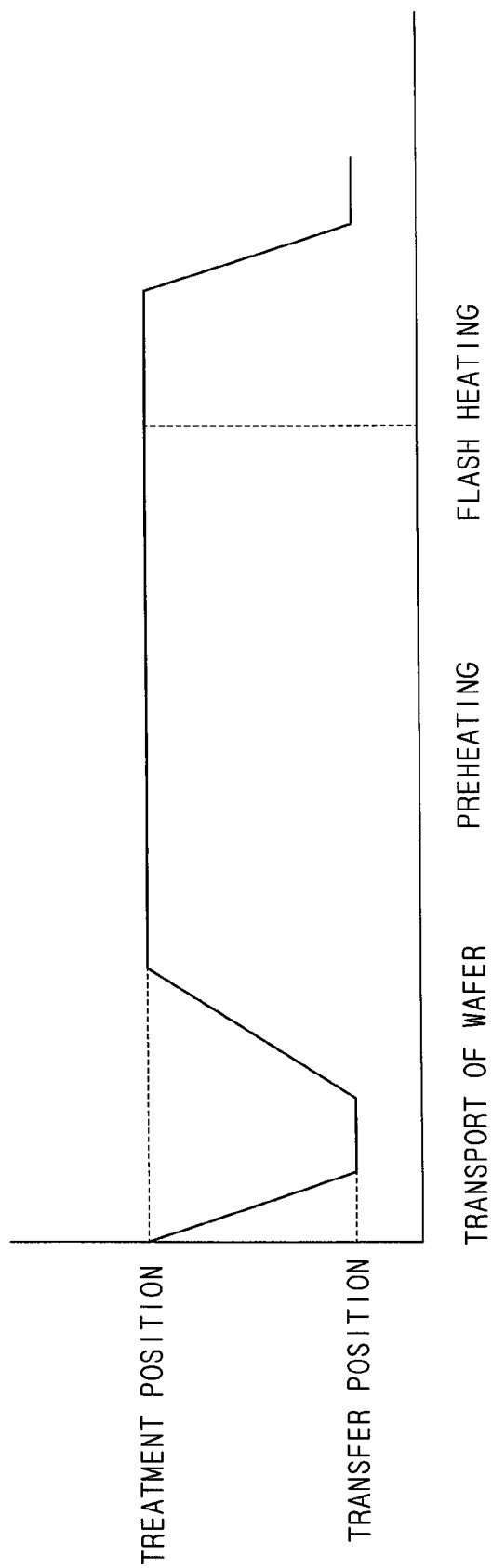
FIG. 7 is a timing diagram showing an up-and-down pattern (or an operating pattern) of a holding part during the steady process.

Next, a procedure for treating the semiconductor wafer W in the heat treatment apparatus 1 will be described. The semiconductor wafer W to be treated in this preferred embodiment is a semiconductor substrate doped with impurities by an ion implantation process. The activation of the implanted impurities is achieved by a flash heating process in the heat treatment apparatus 1. First, a procedure for a steady process of the semiconductor wafer W will be described. The steady process refers to a routine heating process performed by the heat treatment apparatus 1 on an actual semiconductor wafer W. The controller 3 controls the operating mechanisms of the heat treatment apparatus 1 in accordance with the procedure described in the recipe provided from the host computer 100, whereby the steady process proceeds. FIG. 6 is a flow diagram showing the procedure of operations when the heat treatment apparatus 1 performs the steady process on the semiconductor wafer W. FIG. 7 is a timing diagram showing an up-and-down pattern (or an operating pattern) of the holding part 7 during the steady process.

Figure 4:
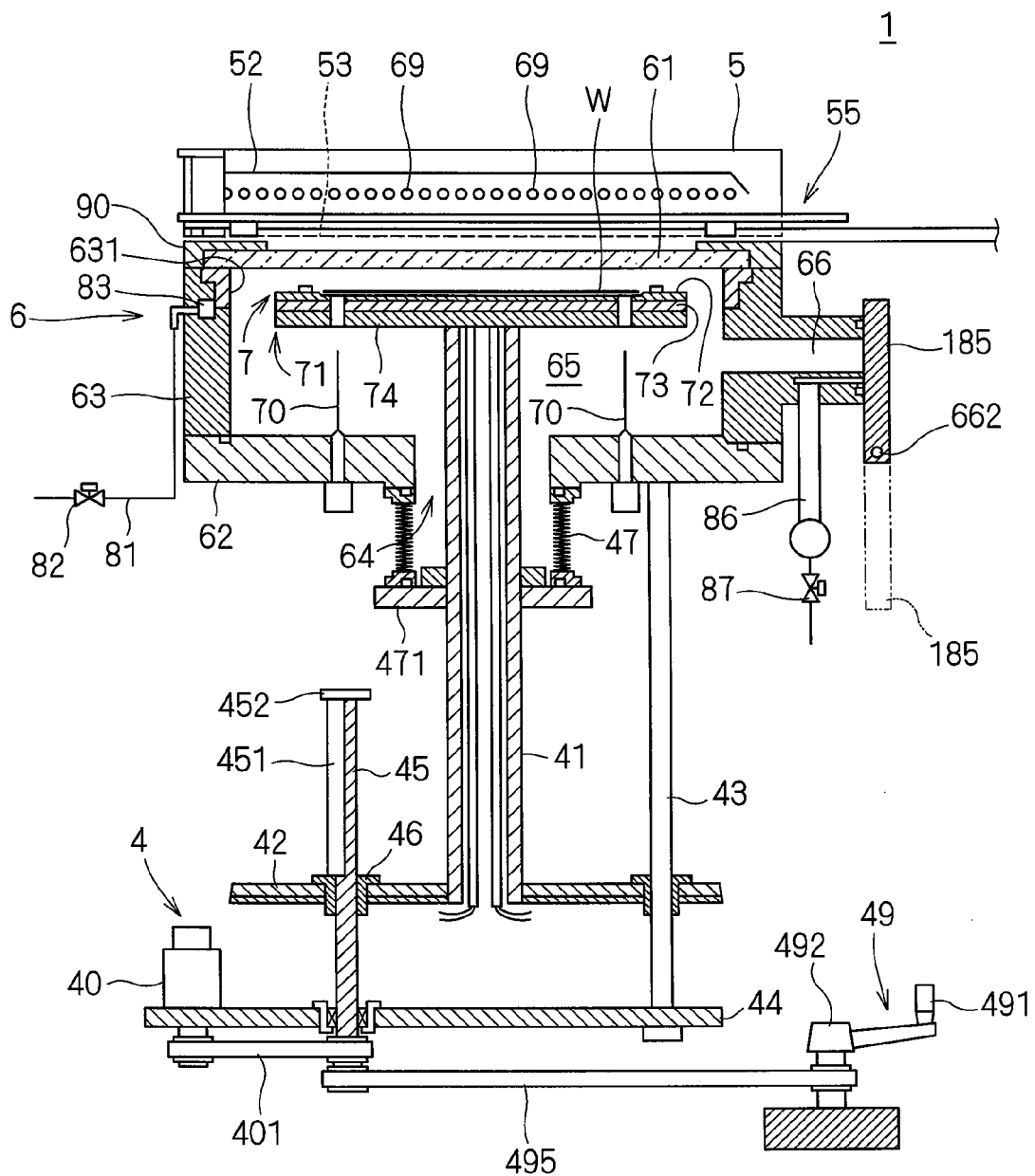
FIG. 4 is a side sectional view showing the construction of the heat treatment apparatus of FIG. 1.

First, the holding part 7 is moved downwardly from the treatment position shown in FIG. 4 to the transfer position shown in FIG. 1 (in Step S1). That is, the reference position of the holding part 7 in the heat treatment apparatus 1 is the treatment position, and the holding part 7 is in the treatment position prior to the treatment. For the start of the treatment, the holding part 7 is moved downwardly to the transfer position. After the holding part 7 is moved downwardly to the transfer position, as shown in FIG. 1, the holding part 7 is close to the chamber bottom portion 62, and the upper ends of the support pins 70 protrude through the holding part 7 upwardly out of the holding part 7.

When the holding part 7 is moved downwardly to the transfer position, the gas valve 82 and the gas valve 87 are opened to introduce nitrogen gas at room temperature into the heat treatment space 65 of the chamber 6. Subsequently, the transport opening 66 is opened by opening the gate valve 185, and a transport robot outside the heat treatment apparatus 1 transports the ion-implanted semiconductor wafer W through the transport opening 66 into the chamber 6 and places the semiconductor wafer W onto the plurality of support pins 70 (in Step S2).

The amount of nitrogen gas fed into the chamber 6 during the transport of the semiconductor wafer W into the chamber 6 shall be about 40 liters per minute. The nitrogen gas fed in the chamber 6 flows from the gas inlet buffer 83 in a direction indicated by the arrows AR4 of FIG. 2, and is exhausted through the outlet passage 86 and the gas valve 87 shown in FIG. 1 by using a utility exhaust system. Part of the nitrogen gas fed into the chamber 6 is also exhausted from an exhaust port (not shown) provided inside the bellows 47. In steps to be described below, the nitrogen gas always continues to be fed into and exhausted from the chamber 6, and the amount of nitrogen gas fed into the chamber 6 is changed to various amounts in accordance with the process steps of the semiconductor wafer W.

After the semiconductor wafer W is transported into the chamber 6, the gate valve 185 closes the transport opening 66. Next, the procedure proceeds to Step S3 in which the holding part elevating mechanism 4 moves the holding part 7 upwardly from the transfer position to the treatment position close to the light-transmittable plate 61. In the course of the upward movement of the holding part 7 from the transfer position, the semiconductor wafer W is transferred from the support pins 70 to the susceptor 72 of the holding part 7, and is placed and held on the upper surface of the susceptor 72. When the holding part 7 is moved upwardly to the treatment position, the semiconductor wafer W placed on the susceptor 72 is also held in the treatment position.

Each of the six zones 711 to 716 of the hot plate 71 is already heated up to a predetermined temperature by the resistance heating wire individually provided within each of the zones 711 to 716 (between the upper plate 73 and the lower plate 74). The holding part 7 is moved upwardly to the treatment position and the semiconductor wafer W comes in contact with the holding part 7, whereby the semiconductor wafer W is preheated and the temperature of the semiconductor wafer W increases gradually (in Step S4).

Preheating the semiconductor wafer W in this treatment position for about 60 seconds increases the temperature of the semiconductor wafer W up to a previously set preheating temperature T1. The preheating temperature T1 shall range from about 200° C. to about 600° C., preferably from about 350° C. to about 550° C., at which there is no apprehension that the impurities implanted in the semiconductor wafer W are diffused by heat. A distance between the holding part 7 and the light-transmittable plate 61 is adjustable to any value by controlling the amount of rotation of the motor 40 of the holding part elevating mechanism 4.

After a lapse of the preheating time of about 60 seconds, a flash of light is emitted from the flash lamps 69 of the lamp house 5 toward the semiconductor wafer W under the control of the controller 3 while the holding part 7 remains in the treatment position. Part of the flash of light emitted from the flash lamps 69 travels directly to the interior of the chamber 6. The remainder of the flash of light is reflected by the reflector 52, and the reflected light travels to the interior of the chamber 6. Such emission of the flash of light achieves the flash heating of the semiconductor wafer W (in Step S5). The flash heating, which is achieved by the emission of a flash of light from the flash lamps 69, can raise the surface temperature of the semiconductor wafer W in a short time.

Specifically, the flash of light emitted from the flash lamps 69 of the lamp house 5 is an intense flash of light emitted for an extremely short period of time ranging from about 0.1 millisecond to about 10 milliseconds because the previously stored electrostatic energy is converted into such an ultrashort light pulse. The surface temperature of the semiconductor wafer W subjected to the flash heating by the emission of the flash of light from the flash lamps 69 momentarily rises to a treatment temperature T2 of about 1000° C. to about 1100° C. After the impurities implanted in the semiconductor wafer W are activated, the surface temperature decreases rapidly. Because of the capability of increasing and decreasing the surface temperature of the semiconductor wafer W in an extremely short time, the heat treatment apparatus 1 can achieve the activation of the impurities while suppressing the diffusion of the impurities implanted in the semiconductor wafer W due to heat. Such a diffusion phenomenon is also known as a round or dull profile of the impurities implanted in the semiconductor wafer W. Because the time required for the activation of the implanted impurities is extremely short as compared with the time required for the thermal diffusion of the implanted impurities, the activation is completed in a short time ranging from about 0.1 millisecond to about 10 milliseconds during which no diffusion occurs.

Preheating the semiconductor wafer W by the holding part 7 prior to the flash heating allows the emission of the flash of light from the flash lamps 69 to rapidly increase the surface temperature of the semiconductor wafer W up to the treatment temperature T2.

After waiting in the treatment position for about 10 seconds following the completion of the flash heating, the procedure proceeds to Step S6 in which the holding part 7 is moved downwardly again to the transfer position shown in FIG. 1 by the holding part elevating mechanism 4, and the semiconductor wafer W is transferred from the holding part 7 to the support pins 70. Subsequently, the gate valve 185 opens the transport opening 66 having been closed, and the transport robot outside the heat treatment apparatus 1 transports the semiconductor wafer W placed on the support pins 70 outwardly (in Step S7). Thus, the flash heating process of the semiconductor wafer W in the heat treatment apparatus 1 is completed. For the treatment of a plurality of semiconductor wafers W in succession, a next new one of the semiconductor wafers W is transported into the chamber 6 and placed on the support pins 70 in Step S7 described above. In other words, the transport robot outside the heat treatment apparatus 1 carries out an exchange between the processed semiconductor wafer W and the unprocessed semiconductor wafer W.

As discussed above, the nitrogen gas is continuously fed into the chamber 6 during the heat treatment of the semiconductor wafer W in the heat treatment apparatus 1. The amount of nitrogen gas fed into the chamber 6 shall be about 30 liters per minute when the holding part 7 is in the treatment position, and be about 40 liters per minute when the holding part 7 is in other than the treatment position.

In the above-mentioned manner, when the heat treatment apparatus 1 performs the steady process on the actual semiconductor wafer W to be treated, the controller 3 controls the hot plate 71 of the holding part 7 to perform the operation of moving upwardly and downwardly (or to make up-and-down movements) in accordance with the up-and-down pattern (or the operating pattern) as shown in FIG. 7. The treatment of a plurality of (e.g., 25) semiconductor wafers in a lot (or batch) in succession in the heat treatment apparatus 1 is as follows.

A processed semiconductor wafer W is transported out of the chamber 6, and a new semiconductor wafer W is transported into the chamber 6. Thereafter, the procedure returns from Step S7 of FIG. 6 to Step S3. The procedure in Steps S3 to S7 is repeated until the treatment of all of the semiconductor wafers W is completed. In the course of this procedure, the hot plate 71 of the holding part 7 also repeatedly performs the operation of moving upwardly and downwardly in accordance with the up-and-down pattern shown in FIG. 7.

During the steady process of the semiconductor wafer W, the controller 3 controls the supply of gas in accordance with a gas supply pattern such that the amount of nitrogen gas fed into the chamber 6 is about 30 liters per minute when the holding part 7 is in the treatment position and is about 40 liters per minute when the holding part 7 is in other than the treatment position, as mentioned above. During the treatment of a plurality of semiconductor wafers W in a lot (or batch) in succession in the heat treatment apparatus 1, the supply of gas in accordance with such a gas supply pattern is repeated as a matter of course.

When the heat treatment apparatus 1 treats a plurality of semiconductor wafers W in a lot (or batch) in succession, the temperature reached by the first several wafers, especially the first one wafer, in the lot during the flash heating tends to be extremely higher than that reached by the remaining wafers, as discussed above. This can be considered to result from the fact that the reference position of the holding part 7 in the heat treatment apparatus 1 is the treatment position so that the hot plate 71 of the holding part 7 continues to be in close proximity to the light-transmittable plate 61 when in a standby condition pending the transport of the first semiconductor wafer W in the lot into the chamber 6. Specifically, the hot plate 71 is heated to a degree which enables the temperature of the semiconductor wafer W to rise to the preheating temperature Ti ranging from about 200° C. to about 600° C. After the hot plate 71 having such a high temperature is positioned in close proximity to the light-transmittable plate 61 for a prolonged period of time, the temperature of the light-transmittable plate 61 is also increased by the radiant heat from the hot plate 71. The first semiconductor wafer W in the lot is preheated near the light-transmittable plate 61 having the increased temperature. Thus, the temperature reached by the first semiconductor wafer W during the flash heating is considered to be higher as a result of the preheating of the first semiconductor wafer W to a temperature higher than its setting.

As the subsequent semiconductor wafers W in the lot are then treated in succession, the holding part 7 repeats the operation of moving upwardly and downwardly in accordance with the up-and-down pattern shown in FIG. 7, so that the hot plate 71 is repeatedly moved toward and away from the light-transmittable plate 61. The temperature of the light-transmittable plate 61 accordingly decreases gradually from the temperature attained when in the above-mentioned standby condition, and is stabilized when the treatment of approximately the fifth semiconductor wafer W in the lot starts. (The temperature of the light-transmittable plate 61 after the temperature is stabilized is referred to hereinafter as a "stabilized temperature.") Accordingly, the preheating temperature is also stabilized when the treatment of approximately the fifth semiconductor wafer W in the lot starts. As a result, the temperature reached by the wafers during the flash heating becomes stable and uniform.

The factor as mentioned above causes the temperature reached by the first several ones of a plurality of semiconductor wafers W in one lot during the flash heating to be higher when the plurality of semiconductor wafers W in the batch are treated in succession. Such a problem comes up pronouncedly with the first semiconductor wafer W in the lot as a matter of course.

To overcome the problem, the controller 3 in this preferred embodiment controls the motor 40 of the holding part elevating mechanism 4 so that the hot plate 71 of the holding part 7 performs the operation of moving upwardly and downwardly in accordance with the up-and-down pattern shown in FIG. 7 (i.e., the up-and-down pattern for the steady process) also when in the standby condition pending the transport of the first semiconductor wafer W in the lot into the chamber 6. That is, the hot plate 71 of the holding part 7 starts making the up-and-down movements similar to those made during the actual treatment before the semiconductor wafer W is transported into the chamber 6. When the holding part 7 performs the operation of moving upwardly and downwardly in the standby condition, the holding part 7 holds no semiconductor wafers W as a matter of course, and the hot plate 71 is heated up to a predetermined temperature approximately equal to the temperature attained during the steady process under the control of the controller 3. The operation of the holding part 7 moving upwardly and downwardly in the standby condition is such that the up-and-down pattern shown in FIG. 7 is repeated a predetermined number of times. The number of cycles the up-and-down pattern is repeated in the standby condition may be approximately equal to the number of semiconductor wafers (in the above example, five) required traditionally to attain the stabilized temperature during the steady process, and may be one or more.

In this manner, the hot plate 71 is repeatedly moved toward and away from the light-transmittable plate 61 without the actual treatment of the semiconductor wafer W, and the temperature of the light-transmittable plate 61 decreases gradually to approach the stabilized temperature attained during the steady process. Then, by the time the first semiconductor wafer W in the lot is transported into the chamber 6 and is treated, the temperature of the light-transmittable plate 61 has already reached the stabilized temperature approximately equal to the temperature attained after the treatment of several semiconductor wafers W. This stabilizes the preheating temperature of all of the semiconductor wafers W subjected to the heating process in succession after the first semiconductor wafer W, to thereby accomplish the stabilized and uniform temperature reached during the flash heating by all of the semiconductor wafers W included in the lot and treated in succession.

The technical significance of the up-and-down movements of the hot plate 71 in accordance with the up-and-down pattern for the steady process in the standby condition pending the transport of the first semiconductor wafer W in the lot into the chamber 6 lies in treating a virtual semiconductor wafer W to cause the hot plate 71 to perform the operation similar to that for the steady process, thereby bringing not only the temperature of the light-transmittable plate 61 but also all environmental parameters for the treatment of the semiconductor wafers W within the chamber 6 close to a stable state attained during the steady process. Thus, the heat treatment apparatus 1 may perform various operations for causing the environmental parameters within the chamber 6 to approach the stable state attained during the steady process, in addition to the operation of the hot plate 71 moving upwardly and downwardly.

As an example, during the steady process of the semiconductor wafer W, the controller 3 in this preferred embodiment controls the supply of gas in accordance with the gas supply pattern such that the amount of nitrogen gas fed into the chamber 6 is about 30 liters per minute when the holding part 7 is in the treatment position and is about 40 liters per minute when the holding part 7 is in other than the treatment position. However, the controller 3 may control the gas valve 82 and the gas valve 87 to provide a supply of nitrogen gas into the chamber 6 in accordance with the gas supply pattern also when in the standby condition pending the transport of the first semiconductor wafer W in the lot into the chamber 6. At this time, the nitrogen gas supply in accordance with the above-mentioned gas supply pattern is provided in operative association with the up-and-down movements of the hot plate 71 in accordance with the up-and-down pattern for the steady process in the standby condition. Specifically, on the assumption that a virtual semiconductor wafer W is transported into the chamber 6 in the standby condition, the up-and-down movements of the hot plate 71 and the gas supply into the chamber 6 are carried out so that the steady process is performed on the virtual semiconductor wafer W.

In this manner, when the first semiconductor wafer W in the lot is transported into the chamber 6 and is treated, the environmental parameters within the chamber 6 can be brought closer to the stable state than if only the up-and-down movements of the hot plate 71 are made alone. As a result, this accomplishes a more stabilized and uniform temperature reached during the flash heating by all of the semiconductor wafers W included in the lot and treated in succession.

Further, the emission of a flash of light from the flash lamps 69 may be carried out in operative association with the up-and-down movements of the hot plate 71 in accordance with the up-and-down pattern for the steady process in the standby condition. Specifically, the controller 3 controls the lighting of the flash lamps 69 so that a flash of light is emitted when the hot plate 71 is moved upwardly to the treatment position in accordance with the up-and-down pattern of FIG. 7 in the standby condition. In this manner, the environmental parameters within the chamber 6 can be brought closer to the stable state than if only the up-and-down movements of the hot plate 71 are made alone. However, frequently turning on the flash lamps 69 in the standby condition results in not only hard wear of the flash lamps 69 but also wasteful consumption of a large amount of electric power. It is therefore preferred that the flash lamps 69 in the standby condition are turned on, as appropriate.

Although the preferred embodiment according to the present invention has been described hereinabove, various modifications in addition to the above may be made therein without departing from the spirit and scope of the present invention. For example, the operations performed in the standby condition under the control of the controller 3 are not limited to the operation of the hot plate 71 moving upwardly and downwardly, the supply of nitrogen gas into the chamber 6 and the emission of a flash of light from the flash lamps 69, but may include other operations similar to those performed by the operating mechanisms of the heat treatment apparatus 1 during the steady process of the actual semiconductor wafer W. As an example, the gate valve 185 may be adapted to open and close the transport opening 66 in operative association with the up-and-down movements of the hot plate 71 in accordance with the up-and-down pattern for the steady process in the standby condition. Specifically, the controller 3 controls the gate valve 185 to open the transport opening 66 when the hot plate 71 is moved downwardly to the transfer position in accordance with the up-and-down pattern of FIG. 7 in the standby condition. The closer the operation of the heat treatment apparatus 1 in the standby condition to that for the steady process in which the actual semiconductor wafer W is treated, the closer the environmental parameters within the chamber 6 to the stable state reached during the steady process. This accomplishes more stabilized and uniform heat treatment of all of the semiconductor wafers W to be subjected to the flash heating process in succession.

The up-and-down movements of the holding part 7 in accordance with the up-and-down pattern of FIG. 7 in the standby condition mentioned above may be started so that the holding part 7 is in the transfer position at the time of transport of the semiconductor wafer W to be treated into the chamber 6. That is, the up-and-down movements of the holding part 7 made in the standby condition as in the above-mentioned preferred embodiment impose limits on the time to transport the first semiconductor wafer W in the lot to be actually treated into the chamber 6 (specifically, when the instant at which the virtual semiconductor wafer W is transported into the chamber 6 during the up-and-down movements of the holding part 7 in accordance with the up-and-down pattern of FIG. 7 in the standby condition and the instant at which the actual semiconductor wafer W is transported into the chamber 6 by the transport robot outside the heat treatment apparatus 1 coincide with each other). The first semiconductor wafer W in the lot to be treated actually can be transported into the chamber 6 without any waiting time by controlling the up-and-down movements of the holding part 7 in the standby condition so that the holding part 7 is in the transfer position at the time of transport of the actual semiconductor wafer W to be treated into the chamber 6.

The treatment of the semiconductor wafer W in the heat treatment apparatus 1 is controlled by the host computer 100, and the controller 3 uses the production management information transmitted from the host computer 100 to the controller 3 to preliminarily know when the transport robot as described above outside the heat treatment apparatus 1 transports the semiconductor wafer W to be treated into the chamber 6. Based on the production management information transmitted from the host computer 100, the controller 3 for the heat treatment apparatus 1 perceives when the first semiconductor wafer W in the lot to be treated is to be transported into the chamber 6, and causes the holding part 7 to start the operation of moving upwardly and downwardly in accordance with the up-and-down pattern for the steady state in the standby condition so that the holding part 7 is in the transfer position at the time of the transport of the first semiconductor wafer W into the chamber 6.

In the preferred embodiment described above, the holding part 7 having the hot plate 71 is configured to perform the operation of moving upwardly and downwardly. Instead, the lamp house 5 may be configured to move upwardly and downwardly relative to the hot plate 71 fixedly provided. In such a configuration, the flash lamps 69 are moved upwardly and downwardly in accordance with a predetermined up-and-down pattern during the steady process of the semiconductor wafer W to be treated. The up-and-down movements of the flash lamps 69 made in accordance with the up-and-down pattern also when in the standby condition pending the transport of the semiconductor wafer W into the chamber 6 allows the environmental parameters within the chamber 6 to approach the stable state attained during the steady process, thereby accomplishing more stabilized and uniform heat treatment of all of the semiconductor wafers W to be subjected to the flash heating process in succession.

Although the 30 flash lamps 69 are provided in the lamp house 5 according to the preferred embodiment described above, the present invention is not limited to this. Any number of flash lamps 69 may be provided. The flash lamps 69 are not limited to the xenon flash lamps but may be krypton flash lamps.

The up-and-down pattern of the holding part 7 is not limited to that shown in FIG. 7, but may be any pattern depending on the details of the treatment.

The gas fed into the chamber 6 is not limited to the nitrogen gas, but other types of gases may be fed. The gas may be fed into the chamber 6 in accordance with any gas supply pattern in which the amount of gas fed into the chamber 6 is set as appropriate within the range from 10 liters per minute to 50 liters per minute.

The technique according to the present invention is not limited to the heat treatment apparatus employing the flash lamps 69, but is applicable to other types of heat treatment apparatuses which perform a heating process on a semiconductor wafer W placed on a hot plate movable (not only in a vertical direction but also in other directions) within a chamber. In such heat treatment apparatuses, the environmental parameters within the chamber vary in such a manner that the temperature of part of a wall surface of the chamber is increased by the movement of the hot plate within the chamber. Thus, a configuration such that the hot plate moves in accordance with the operating pattern for the steady process also when in the standby condition pending the transport of the first semiconductor wafer W in a lot into the chamber can bring the environmental parameters within the chamber at the time of the start of the treatment of the semiconductor wafer transported into the chamber close to the stable state attained during the steady process, thereby accomplishing the stabilized and uniform heat treatment of all of the semiconductor wafers W to be subjected to the heating process in succession.

In the preferred embodiment described above, the ion activation process is performed by exposing the semiconductor wafer to light. The substrate to be treated by the heat treatment apparatus according to the present invention is not limited to the semiconductor wafer. For example, the heat treatment apparatus according to the present invention may perform the treatment on a glass substrate formed with various silicon films including a silicon nitride film, a polycrystalline silicon film and the like. As an example, silicon ions are implanted into a polycrystalline silicon film formed on a glass substrate by a CVD process to form an amorphous silicon film, and a silicon oxide film serving as an anti-reflection film is formed on the amorphous silicon film. In this state, the heat treatment apparatus according to the present invention may expose the entire surface of the amorphous silicon film to light to polycrystallize the amorphous silicon film, thereby forming a polycrystalline silicon film.

Another modification may be made in a manner to be described below. A TFT substrate is prepared such that an underlying silicon oxide film and a polysilicon film produced by crystallizing amorphous silicon are formed on a glass substrate and the polysilicon film is doped with impurities such as phosphorus or boron. The heat treatment apparatus according to the present invention may expose the TFT substrate to light to activate the impurities implanted in the doping step.

While the invention has been described in detail, the foregoing description is in all aspects illustrative and not restrictive. It is understood that numerous other modifications and variations can be devised without departing from the scope of the invention.

What is claimed is:

1. A heat treatment method for exposing a substrate placed on a heating plate to a flash of light emitted from a flash lamp to perform a heating process on the substrate, comprising the steps of:

upwardly and downwardly moving said heating plate between a transfer position and a treatment position in accordance with a predetermined up-and-down pattern of movement when performing a steady process on a substrate to be treated, said transfer position being a position in which said heating plate lies when a substrate is transported into and out of a chamber for housing said heating plate therein, said treatment position being a position in which said heating plate lies when a substrate is exposed to a flash of light emitted from said flash lamp; and upwardly and downwardly moving said heating plate in accordance with said up-and-down pattern during the entire period when the heating plate is in a standby condition pending the transport of the substrate into said chamber.

2. The heat treatment method according to claim 1, wherein said flash lamp emits a flash of light when said heating plate is moved to said treatment position in accordance with said up-and-down pattern in said standby condition.

3. The heat treatment method according to claim 1, wherein a gas is supplied into said chamber in accordance with a predetermined gas supply pattern when performing said steady process on a substrate to be treated, and the gas is supplied into said chamber in accordance with said gas supply pattern in operative association with the movement of said heating plate in accordance with said up-and-down pattern in said standby condition.

4. The heat treatment method according to claim 1, wherein the upward and downward movement of said heating plate in said standby condition is started so that said heating plate is in said transfer position at the time of the transport of the substrate into said chamber.

* * * * *